US008894522B2

(12) United States Patent
Heinrich et al.

(10) Patent No.: US 8,894,522 B2
(45) Date of Patent: Nov. 25, 2014

(54) DRIVE END-BLOCK FOR A ROTATABLE MAGNETRON

(75) Inventors: Hans-Juergen Heinrich, Grossroehrsdorf (DE); Goetz Grosser, Dresden (DE); Thorsten Sander, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 1127 days.

(21) Appl. No.: 12/421,810

(22) Filed: Apr. 10, 2009

(65) Prior Publication Data

US 2009/0258739 A1 Oct. 15, 2009

(30) Foreign Application Priority Data

Apr. 11, 2008 (DE) .......................... 10 2008 018 609

(51) Int. Cl.
F16H 7/00 (2006.01)
C23C 14/00 (2006.01)
C25B 11/00 (2006.01)
C25B 13/00 (2006.01)
C23C 14/32 (2006.01)
H01J 37/34 (2006.01)

(52) U.S. Cl.
CPC ......... H01J 37/3405 (2013.01); H01J 37/3435 (2013.01)
USPC ................. 474/148; 204/298.22; 204/298.23; 204/298.2; 204/298.35; 204/192.12

(58) Field of Classification Search
USPC .............. 204/298.22, 298.23, 298.2, 298.35, 204/192.12; 474/148
See application file for complete search history.

(56) References Cited

U.S. PATENT DOCUMENTS

| 4,422,916 | A |   | 12/1983 | McKelvey |           |
|-----------|---|---|---------|----------|-----------|
| 4,445,997 | A |   | 5/1984  | McKelvey |           |
| 4,525,264 | A |   | 6/1985  | Hoffman  |           |
| 5,096,562 | A | * | 3/1992  | Boozenny et al. | ........ 204/298.22 |
| 5,100,527 | A | * | 3/1992  | Stevenson et al. | ........ 204/298.22 |
| 5,200,049 | A | * | 4/1993  | Stevenson et al. | ........ 204/298.22 |
| 6,736,948 | B2 | * | 5/2004 | Barrett  | ..................... 204/298.22 |

FOREIGN PATENT DOCUMENTS

EP 1365436 A2 11/2003

* cited by examiner

*Primary Examiner* — Henry Liu
(74) *Attorney, Agent, or Firm* — Heslin Rothenberg Farley & Mesiti P.C.

(57) ABSTRACT

A drive end block for a rotatable magnetron comprises a housing, which has a vacuum-tight rotary feedthrough extending through a wall of the housing, and a drive apparatus for generating a torque. An output end of the rotary feedthrough lies outside the housing for connection to the rotatable magnetron and a drive end of the rotary feedthrough lies inside the housing for introducing a torque. The drive apparatus is situated outside the housing of the drive end block and is connected using a torque transmission apparatus to the drive end of the rotary feedthrough so that the drive apparatus is electrically insulated from the housing and the rotary feedthrough of the drive end block.

8 Claims, 1 Drawing Sheet

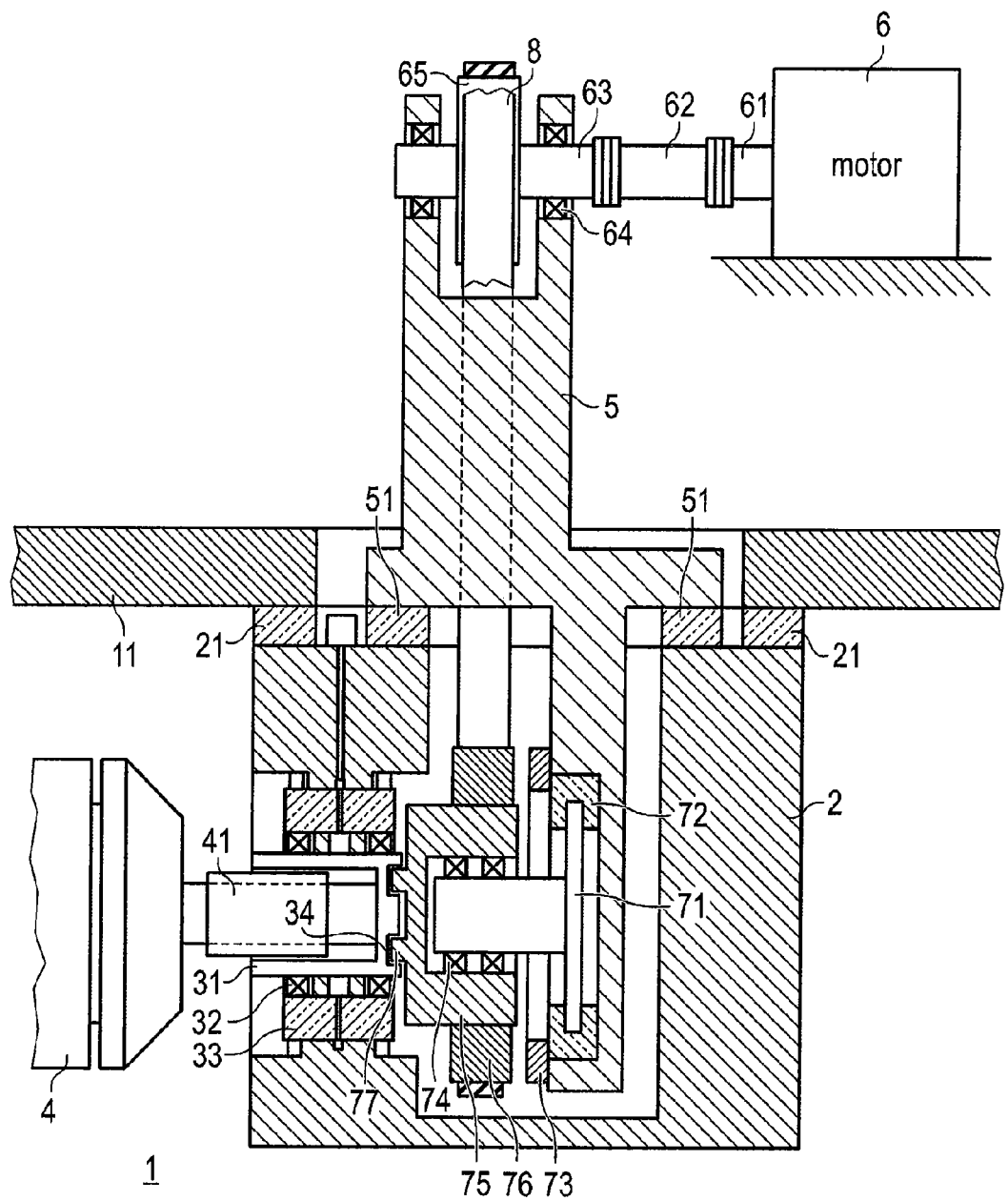

DRIVE END-BLOCK FOR A ROTATABLE MAGNETRON

CROSS REFERENCE TO RELATED APPLICATIONS

This application claims priority of German application No. 10 2008 018 609.0 filed on Apr. 11, 2008, the entire disclosure of this application being hereby incorporated herein by reference.

BACKGROUND ART

A drive end block for a rotatable magnetron is described hereafter, which has a simple construction and is easy to maintain.

So-called rotatable magnetrons are known in vacuum coating technology, in which a typically tubular target encloses a magnet configuration, the tubular target being mounted so it is rotatable and being drivable, so that the target material is ablated uniformly. The rotating magnetron is typically fastened in the vacuum chamber of a vacuum coating facility between two end blocks, which are designed so that they allow the rotatable mounting of the tubular target in each case. Different functions are usually assigned to the two end blocks in this case. One of the end blocks is typically implemented as a supply end block for supplying the magnetron with cooling water and electrical power and the other end block is implemented as a drive end block for introducing a torque to generate the rotation of the tubular target.

Known drive end blocks have an electromechanical drive apparatus in the form of an electric motor having gears for this purpose, which introduces the torque via bevel gears, spur gears, or toothed belts, for example. This drive apparatus must be free of potential and is therefore installed insulated in relation to the target and in relation to the vacuum chamber. Therefore, the drive apparatus is installed directly in the drive end block using insulators in known drive end blocks. As a function of the level of the electrical processing voltage, the outlay for the potential separation may be very great, in order that the processing voltage applied to the tubular target is reliably prevented from flashing over onto the drive apparatus or the vacuum chamber.

Inside the vacuum chamber, the torque is typically transmitted via an insulated coupling element from the drive apparatus situated in the interior of the drive end block to the target located in the vacuum chamber. Because the drive end block unifies the functions of introducing rotation, electrical insulation, and the vacuum seal, the components of the drive end block must be manufactured and mounted with great precision.

BRIEF SUMMARY OF INVENTION

An improved drive end block is disclosed, in which the requirements for the manufacturing tolerances of the components are lower than in known drive end blocks, the drive apparatus being electrically insulated from the parts which conduct the processing voltage and from the vacuum chamber, and in which the drive apparatus may be maintained without dismounting the drive end block.

A drive end block for a rotating magnetron is proposed, which comprises a housing having a vacuum-tight rotary feedthrough extending through a wall of the housing, and a drive apparatus for generating a torque, the output end of the rotary feedthrough lying outside the housing being implemented for the connection to the rotating magnetron and the drive end of the rotary feedthrough lying inside the housing being implemented for introducing a torque, and the drive apparatus being situated outside the housing of the drive end block and being connected to the drive end of the rotary feedthrough using a torque transmission apparatus so that the drive apparatus is electrically insulated from the housing and the rotary feedthrough of the drive end block.

The improved ease of maintenance of the proposed drive end block is primarily achieved in that the drive apparatus is no longer situated inside the housing of the drive end block. The drive apparatus, i.e., the geared motor used, for example, is thus accessible without dismounting the drive end block. It is thus also possible to situate the drive apparatus completely outside the vacuum chamber. The drive apparatus is situated so it is electrically insulated from the tubular target and the vacuum chamber itself significantly more easily in this way.

The freedom from potential of the drive apparatus may be achieved, for example, in that the torque transmission apparatus is manufactured entirely from electrically nonconductive materials such as plastic or ceramic. Alternatively thereto, the torque transmission apparatus may be implemented so that at least a part of the components of the torque transmission apparatus are produced from nonconductive materials, which are situated so that there is no continuous conductive connection between the drive apparatus and the drive end of the rotary feedthrough.

For example, the torque transmission apparatus may comprise an electrically nonconductive toothed belt, which connects an output wheel of the drive apparatus to a drive wheel situated on the drive end of the rotary feedthrough and transmits the torque from the drive apparatus to the rotary feedthrough in this way. Further examples of concrete embodiments of the torque transmission apparatus are chain drives, propeller shafts, and similar apparatuses, which are familiar to one skilled in the art for transmitting torques.

Independently of the way in which the torque transmission apparatus is implemented in the concrete case, however, it is to be ensured that there is no continuous conductive connection between the tubular target and the drive apparatus. This may be achieved, as in the above example of a toothed belt, in that the traction means (e.g., toothed belt, link chain, propeller shaft, etc.) is manufactured from nonconductive material. Alternatively or additionally, the components of the drive apparatus and/or the rotary feedthrough which are engaged with or connected to the traction means (belt wheels, chain pinion, universal joint, etc.) may be manufactured from nonconductive material.

It may also be provided that at least the connection shaft of the rotary feedthrough, which has contact to the tubular target, is manufactured from nonconductive material. If the connection shaft is manufactured from a conductive material, it must also be provided that the connection shaft is electrically insulated in relation to the housing of the drive end block. This may be implemented, for example, in that the connection shaft is mounted so it is rotatable and vacuum-tight in an electrically nonconductive mounting element, which is fastened vacuum-tight in an opening of a wall of the housing of the drive end block.

If both the housing of the drive end block inside the vacuum chamber and also the drive apparatus outside the vacuum chamber are situated fixed in place in relation to the vacuum chamber, no further measures are needed to produce the operational link between the output wheel of the drive apparatus and the drive end of the rotary feedthrough. However, it may also be provided that the torque transmission apparatus also comprises a support apparatus, which is connected fixed to the housing of the drive end block or the vacuum chamber and, on whose end located outside the vacuum chamber, the output wheel of the drive apparatus is mounted so it is rotatable.

In a further embodiment it is provided that a drive wheel of the rotary feedthrough is mounted electrically insulated independently of the rotary feedthrough and the housing in the interior of the housing of the drive end block. For this purpose, for example, an axle stub, on which the drive wheel is mounted so it is rotatable, may be fastened so it is electrically insulated on the wall of the housing. The torque transmission from the drive wheel to the rotary feedthrough may be implemented in this case by formfitting design of the ends of rotary feedthrough and drive wheel facing toward one another.

BRIEF DESCRIPTION OF DRAWING FIGURES

The invention is explained in greater detail hereafter on the basis of an exemplary embodiment and an associated drawing. Single FIG. 1 of the drawing shows an overall view of a drive end block for a tubular magnetron, which is mounted in a vacuum chamber of a vacuum coating facility.

DETAILED DESCRIPTION

The housing 2 of the drive end block, which is open upward and thus to the atmosphere side, is located in the interior of the vacuum chamber 1, the housing being attached vacuum-tight and electrically insulated on a chamber wall 11 of the vacuum chamber 1 using an insulator element 21.

A rotary feedthrough is mounted so it is rotatable in a vacuum-tight and electrically insulated way in a wall of the housing 2. The rotary feedthrough comprises a profiled hollow shaft 31, which is mounted so it is rotatable in roller bearings 32. The roller bearings 32 are in turn mounted in an insulator bushing 33, which ensures the electrical insulation of the profiled hollow shaft 31 and the roller bearings 32 in relation to the housing 2.

The tubular cathode 4 of a rotating magnetron is fastened on the output end of the profiled hollow shaft 31, which lies outside the housing 2 and thus inside the vacuum chamber 1, in that a profiled end of an adapter 41 attached to the tubular cathode 4 is inserted into the hollow end of the profiled hollow shaft 31, so that a form fit is produced between the profiled hollow shaft 31 and the adapter 41, so that a torque may be transmitted from the profiled hollow shaft 31 onto the adapter 41.

A support apparatus 5, which is electrically insulated by an insulator element 51, is attached at the upper end of the drive end block on the atmosphere side so that its upper end projects outside beyond the upper chamber wall 11 of the vacuum chamber 1 and its lower end projects into the housing 2 of the drive end block.

A drive apparatus is located outside the vacuum chamber 1, a geared motor 6 in the exemplary embodiment, whose output shaft 61 is operationally linked via a coupling shaft 62, which is manufactured from electrically nonconductive material, to a toothed belt wheel 65, which is situated on a shaft 63, which is mounted so it is rotatable on the upper end of the support apparatus 5 in roller bearings 64. The torque which is provided by the drive apparatus 6 at the output shaft 61 is thus transmitted via the coupling shaft 62 and the shaft 63 to the toothed belt wheel 65.

An axle stub 71 is situated in an insulator bushing 72, which is in turn fastened using a retainer ring 73 on the support apparatus 5, on the lower end of the support apparatus 5 lying in the interior of the housing 2 of the drive end block. A tappet 75 is mounted so it is rotatable on roller bearings 74 on the axle stub 71. A toothed belt wheel 76, which is manufactured from an electrically nonconductive material, is situated on the tappet 75.

The drive end of the profiled hollow shaft 31 lying in the interior of the housing 2 has a formfitting operational link to the tappet 75, so that a torque may be transmitted from the toothed belt wheel 76 to the tappet 75, from the tappet 75 to the profiled hollow shaft 31, and from the profiled hollow shaft 31 to the adapter 41 of the tubular cathode 4. For this purpose, the tappet 75 has multiple cams 77 on its side facing toward the profiled hollow shaft, which engage in corresponding frontal depressions 34 of the drive end of the profiled hollow shaft 31 lying inside the housing 2 to transmit torque.

The toothed belt wheel 65, which is situated outside the housing 2, is operationally linked to the toothed belt wheel 76, which is situated inside the housing 2, by a toothed belt 8, which is manufactured from an electrically nonconductive material. The drive torque is thus transmitted from the toothed belt wheel 65 to the toothed belt wheel 76.

The invention claimed is:

1. A drive end block for a rotatable magnetron, comprising a housing located in an interior of a vacuum chamber and attached to a supporting wall of the vacuum chamber, the housing having a vacuum-tight rotary feedthrough extending through a wall of the housing, said housing wall being perpendicular to the supporting wall of the vacuum chamber, and a drive apparatus for generating a torque, an output end of the rotary feedthrough lying outside the housing and inside the vacuum chamber for connection to the rotatable magnetron and a drive end of the rotary feedthrough lying inside the housing for introducing a torque, wherein the drive apparatus is situated outside the housing of the drive end block and is connected to the drive end of the rotary feedthrough through an opening in the supporting wall of the vacuum chamber using a torque transmission apparatus, the drive apparatus is electrically insulated from the housing and from the rotary feedthrough of the drive end block, and wherein, in an interior of the housing, a drive wheel of the rotary feedthrough is mounted to rotate on, about, and relative to a central immobile axle stub and electrically insulated independently of the rotary feedthrough and the housing.

2. The drive end block according to claim 1, wherein at least one component of the torque transmission apparatus comprises nonconductive materials and is situated so that there is no continuous conductive connection between the drive apparatus and the drive end of the rotary feedthrough.

3. The drive end block according to claim 2, wherein the torque transmission apparatus comprises an electrically nonconductive fraction means, which connects the drive apparatus to the rotary feedthrough.

4. The drive end block according to claim 3, wherein parts which are engaged with the traction means comprise nonconductive material.

5. The drive end block according to claim 1, wherein the torque transmission apparatus also comprises a support apparatus fixedly connected to the housing of the drive end block or the vacuum chamber.

6. The drive end block according to claim 5, wherein an output wheel of the drive apparatus is mounted so the output wheel is rotatable on an end of the support apparatus located outside the vacuum chamber and the housing.

7. The drive end block according to claim 5, wherein the central stationary axle stub is situated in an insulator bushing fastened on a lower end of the support apparatus.

8. The drive end block according to claim 7, wherein the drive wheel is situated on a tappet that engages, through at least one cam, the drive end of the rotary feedthrough.

\* \* \* \* \*

UNITED STATES PATENT AND TRADEMARK OFFICE
CERTIFICATE OF CORRECTION

PATENT NO.        : 8,894,522 B2
APPLICATION NO.   : 12/421810
DATED             : November 25, 2014
INVENTOR(S)       : Heinrich et al.

Page 1 of 1

It is certified that error appears in the above-identified patent and that said Letters Patent is hereby corrected as shown below:

In the Claims

Column 4, Line 53: Claim 3, Delete "fraction" and insert --traction--

Signed and Sealed this
Fourteenth Day of April, 2015

Michelle K. Lee
*Director of the United States Patent and Trademark Office*